United States Patent
Jung et al.

(10) Patent No.: US 8,633,489 B2
(45) Date of Patent: Jan. 21, 2014

(54) SEMICONDUCTOR DEVICE AND METHOD OF MANUFACTURING THE SAME

(75) Inventors: In-young Jung, Yongin (KR); Choong-youl Im, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/411,315

(22) Filed: Mar. 2, 2012

(65) Prior Publication Data

US 2012/0161118 A1  Jun. 28, 2012

Related U.S. Application Data

(62) Division of application No. 11/856,658, filed on Sep. 17, 2007, now Pat. No. 8,153,531.

(30) Foreign Application Priority Data

Mar. 22, 2007 (KR) .................. 10-2007-0028164

(51) Int. Cl.
*H01L 29/04* (2006.01)
(52) U.S. Cl.
USPC .......................................................... 257/59
(58) Field of Classification Search
USPC .................................... 438/736, 738; 257/59
See application file for complete search history.

(56) References Cited

U.S. PATENT DOCUMENTS

| | | | |
|---|---|---|---|
| 5,518,860 A * | 5/1996 | Niikura et al. | 430/191 |
| 6,259,838 B1 * | 7/2001 | Singh et al. | 385/31 |
| 6,338,989 B1 | 1/2002 | Ahn et al. | |
| 6,586,286 B2 | 7/2003 | Park et al. | |
| 6,624,443 B2 | 9/2003 | Tanabe et al. | |
| 6,720,199 B2 | 4/2004 | Matsubara | |
| 6,850,291 B2 * | 2/2005 | Song | 349/43 |
| 2005/0142680 A1 | 6/2005 | Ha et al. | |
| 2006/0001638 A1 | 1/2006 | Jeon et al. | |
| 2006/0252168 A1 | 11/2006 | Rhee et al. | |

FOREIGN PATENT DOCUMENTS

| | | |
|---|---|---|
| JP | 2002-333641 | 11/2002 |
| JP | 2003-066867 | 3/2003 |
| JP | 2003-195329 | 7/2003 |
| JP | 2004-079509 | 3/2004 |
| JP | 2004-157151 | 6/2004 |
| JP | 2005-033855 | 2/2005 |
| JP | 2005-157312 | 6/2005 |
| JP | 2006-018225 | 1/2006 |

(Continued)

OTHER PUBLICATIONS

Japanese Office action dated Sep. 29, 2009, for corresponding Japanese application 2007-134649.

(Continued)

*Primary Examiner* — Wael Fahmy
*Assistant Examiner* — Sarah Salerno
(74) *Attorney, Agent, or Firm* — Christie, Parker & Hale, LLP

(57) ABSTRACT

Disclosed are a semiconductor device, which forms two insulation layers having different patterns by one mask process, and a method of manufacturing the same. In a semiconductor device having double insulation layers, a photosensitive material is included in an upper insulation layer. During a manufacture of the semiconductor device, the photosensitive material is used as a photo resist layer in order to reduce the number of masks.

14 Claims, 7 Drawing Sheets

(56) References Cited

FOREIGN PATENT DOCUMENTS

| | | |
|---|---|---|
| JP | 2006-018283 | 1/2006 |
| JP | 2006-114499 | 4/2006 |
| JP | 2006-189775 | 7/2006 |
| JP | 2006-220786 | 8/2006 |
| JP | 2006-221170 | 8/2006 |
| JP | 2007-041186 | 2/2007 |
| JP | 2007-041561 | 2/2007 |
| JP | 2007-172873 | 7/2007 |
| KR | 2003-0096729 | 12/2003 |
| KR | 10-2004-0015655 | 2/2004 |
| KR | 10-2006-0060179 | 6/2006 |
| KR | 10-0637228 | 10/2006 |

OTHER PUBLICATIONS

Patent Abstracts of Japan for Japanese Publication No. 2006-114499, published Apr. 27, 2006 in the name of Kang Tae-Wook.
Patent Abstracts of Japan, Publication No. 2003-195329; Date of Publication: Jul. 9, 2003; in the name of Takashi Sato, et al.
Korean Patent Abstracts, Publication No. 1020030096729 A; Date of Publication: Dec. 31, 2003; in the name of Geum Nam Kim.
Korean Patent Abstracts, Publication No. 1020040015655 A; Date of Publication: Feb. 19, 2004; in the name of Do Hyeon Choi, et al.
Korean Patent Abstracts, Publication No. 1020060060179 A; Date of Publication: Jun. 5, 2006; in the name of Ock Hee Kim.
Korean Patent Abstracts, Publication No. 100637228 Bl; Date of Publication of Application (application No. 1020050070640) Oct. 16, 2006; in the name of Sang Hun Oh.

* cited by examiner

SEMICONDUCTOR DEVICE AND METHOD OF MANUFACTURING THE SAME

CROSS-REFERENCE TO RELATED APPLICATION

This application is a divisional of U.S. patent application Ser. No. 11/856,658, filed Sep. 17, 2007, which claims priority to and the benefit of Korean Patent Application No. 10-2007-0028164, filed Mar. 22, 2007, the entire content of both of which is incorporated herein by reference.

BACKGROUND

1. Field of the Invention

The present invention relates to a semiconductor device and a method of manufacturing the same, more particularly, to a semiconductor device including double insulation layers and a method of manufacturing the same.

2. Discussion of Related Art

A photolithography manufacturing method using masks corresponding to respective insulation layers has been used to form a semiconductor device that includes double insulation layers having different patterns.

An example of a semiconductor device that includes such double insulation layers is an organic light emitting display. FIG. 1 is a cross-sectional view showing an organic light emitting display. Referring to FIG. 1, a buffer layer 505 of an image display portion 500 is formed on a substrate 400. A thin film transistor and an organic light emitting diode are formed on the buffer layer 505. Here, the organic light emitting diode is connected to the thin film transistor. A pad of a pad portion 600 is formed on the buffer layer 505.

The thin film transistor includes a semiconductor layer 510, a gate insulation layer 520, a gate electrode 525, an interlayer insulating layer 530, and source/drain electrodes 541 and 545. The semiconductor layer 510 includes source/drain regions 511 and 515. The source/drain electrodes 541 and 545 are connected to the source/drain regions 511 and 515, respectively.

An insulation layer 550 is formed on the thin film transistor. In FIG. 1, the insulation layer 550 includes a passivation layer 550a and a planarization layer 550b. The organic light emitting diode is formed on the insulation layer 550 and connected to the thin film transistor through a via hole 555, which is connected to the drain electrode 545 of the source/drain electrodes 541 and 545 of the thin film transistor.

The organic light emitting diode includes an anode electrode 560, a cathode electrode 590, and an organic layer 580. The organic layer 580 is formed between the anode electrode 560 and the cathode electrode 590. A pixel division film 570 is formed on (or over) the substrate 400 and includes an opening portion 575 for exposing a part of the anode electrode 560. The anode electrode 560 includes a reflection electrode, and the cathode electrode 590 includes a transmission electrode.

In more detail, the anode electrode 560 includes a laminate film composed of a reflection film 560a and a transparent conductive film 560b. In one embodiment, the anode electrode 560 is formed of an Ag/ITO film. A first conductive pattern 527 is formed on the gate insulation layer 520 at the pad portion 600. The interlayer insulating layer 530 is formed on the gate insulation layer 520 and includes a first opening portion 537 for exposing a part of a first conductive pattern 527. A second conductive pattern 547 is formed on the interlayer insulating layer 530 to be connected to the first conductive pattern 527 through the first opening portion 537. The insulation layer 550 includes a first opening portion 557 for exposing a part of the second conductive pattern 547. As described above, the insulation layer 550 includes the passivation layer 550a and the planarization layer 550b.

Here, the pad portion 600 includes the first conductive pattern 527 and the second conductive pattern 547. The first conductive pattern 527 is exposed by the first opening portion 537 formed at the interlayer insulating layer 530. The second conductive pattern 547 is connected to the first conductive pattern 527 through the first opening portion 537, and is exposed by the first opening portion 557 formed at the insulation layer 550. The pad portion 600 is coated with an amorphous conductive film 601 for adhesion with a connection circuit (or connection circuit board), such as a Flexible Printed Circuit (FPC).

The first conductive pattern 527 is formed by the same material as that of the gate electrode 525 of the thin film transistor, which is formed at the image display portion 500. The first conductive pattern 527 includes metal materials, such as MoW, Al, AlNd, or Cr. The second conductive pattern 547 is formed by the same material as that of the source/drain electrodes 541 and 545. The second conductive pattern 547 includes metal materials, such as MoW or Al.

In the above described organic light emitting display, the passivation layer 550a and the planarization layer 550b are provided between the thin film transistor and the organic light emitting diode as double insulation layers.

The planarization layer 550b functions to optimize a resonant structure of the organic light emitting diode by planarizing one or more layers that the planarization layer 550b is formed on (or with).

The passivation layer 550a provides a position for forming a seal between substrates of the organic light emitting display. Further, the passivation layer 550a prevents (or protects from) a wiring opening and/or a short circuit due to a scratch at the pad portion 600 and improves the dispersion of the transistor through a heat treatment. Here, the passivation layer 550a and the planarization layer 550b are shaped with different patterns.

Accordingly, to form the planarization layer of the above described organic light emitting display, a first mask process (or masking process) is required. Also, there is a need for an additional (or second) mask process to form the passivation layer.

However, since one or more additional processes, such as an etching process and a washing process, need to be performed due to the additional mask process, the additional mask process increases the overall manufacturing cost (and time) and may also damage the organic light emitting display being manufactured.

SUMMARY OF THE INVENTION

Aspects of embodiments of the present invention are directed to a semiconductor device including two insulation layers having different patterns formed by one (or a single) mask process, and a method of manufacturing the same.

A first embodiment of the present invention provides a semiconductor device including double insulation layers. The double insulation layers include: a first insulation layer having a first pattern; and a second insulation layer on the first insulation layer and including a photosensitive material, the second insulation layer having a second pattern differing from the first pattern and including a material differing from that of the first insulation layer; wherein the double insulation layers further include: a first region in which the first insulation layer and the second insulation layer overlap; a second region in which the first insulation layer is disposed without the second insulation layer; and a third region in which the first and second insulation layers are absent.

A second embodiment of the present invention provides an organic light emitting display including a display region formed on a substrate; a non-display region being electrically connected to the display region in which at least one terminal is disposed; and double insulation layers. The double insulation layers include: a first insulation layer having a first pattern; and a second insulation layer on the first insulation layer and comprising a photosensitive material, the second insulation layer having a second pattern differing from the first pattern and including a material differing from that of the first insulation layer, wherein the display region includes a double-insulation region in which the first insulation layer and the second insulation layer overlap and a non-insulation region in which the first and second insulation layers are absent, and wherein the non-display region comprises a single-insulation region in which the first insulation layer is disposed without the second insulation layer and a non-insulation region in which the first and second insulation layers are absent.

A third embodiment of the present invention provides a method of manufacturing an insulation layer of a semiconductor device including double insulation layers. A formation of the double insulation layers includes: coating a first insulation layer on an entire surface of a substrate; coating a second insulation layer on the first coated insulation layer, the second insulation layer including a photosensitive material and being formed of a material differing from that of the first insulation layer; patterning the second insulation layer to form a first region, a second region, and a third region, wherein, in the first region, the second insulation layer is formed to have a first pattern of a first thickness, wherein, in the second region, the second insulation layer is formed to have a second pattern of a second thickness less than the first thickness, and wherein, in the third region, the second insulation layer is removed to expose the first insulation layer formed at a lower portion of the second insulation layer; etching the first insulation layer of the third region; removing the second pattern of the second insulation layer; and ashing the first pattern of the second insulation layer such that the first pattern of the second insulation layer remains.

A fourth embodiment of the present invention provides a method of manufacturing an organic light emitting display including: a display region formed on a substrate; a non-display region being electrically connected to the display region in which at least one terminal is formed; and double insulation layers. A formation of the double insulation layers includes: forming a first insulation layer; forming a second insulation layer on the first insulation layer, the second insulation layer including a photosensitive material and being formed of a material differing from that of the first insulation layer; patterning the second insulation layer to form a first region, a second region, and a third region, wherein, in the first region, the second insulation layer is formed to have a first pattern of a first thickness, wherein, in the second region, the second insulation layer is formed to have a second pattern of a second thickness less than the first thickness, and wherein, in the third region, the second insulation layer is removed to expose the first insulation layer formed at a lower portion of the second insulation layer; etching the first insulation layer of the third region; removing the second pattern of the second insulation layer; and ashing the first pattern of the second insulation layer such that the first pattern of the second insulation layer remains.

A fifth embodiment of the present invention provides an organic light emitting display having a display region and a non-display region and including: a thin film transistor; a first insulation layer on the thin film transistor having a first pattern; a second insulation layer on the first insulation layer and including a photosensitive material, the second insulation layer having a second pattern differing from the first pattern and comprising a material differing from that of the first insulation layer; and an organic light emitting diode on the second insulating layer, wherein the first insulation layer and the second insulation layer are arranged to have a double-insulation region in which the first insulation layer and the second insulation layer overlap, a non-insulation region in which the first and second insulation layers are absent, and a single-insulation region in which the first insulation layer is disposed without the second insulation layer, wherein the double-insulation region and the non-insulation region are disposed in the display region, and wherein the single-insulation region and the non-insulation region are disposed in the non-display region.

In the semiconductor device according to the present invention, double insulation layers having different patterns are formed by one (or only one) mask, which leads to a reduction in processes and cost.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
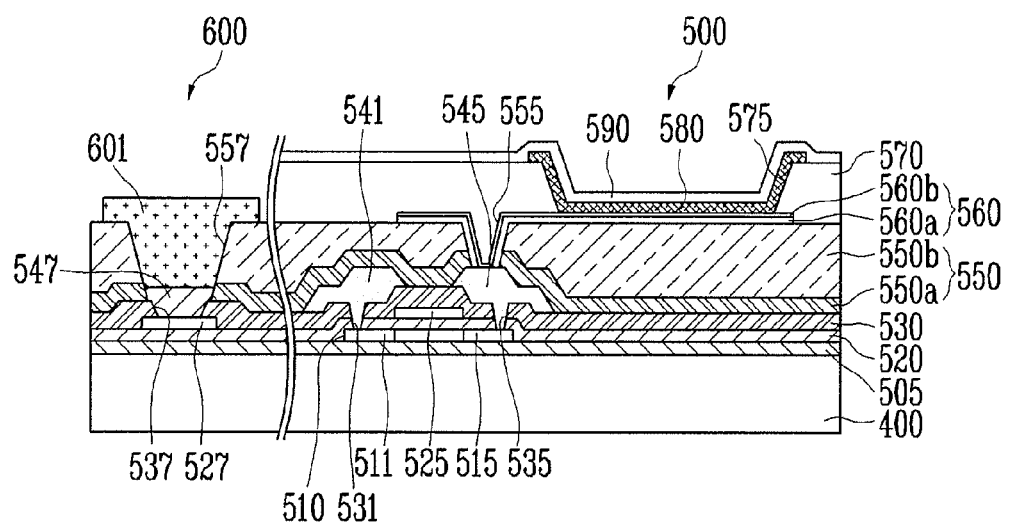
FIG. 1 is a cross-sectional schematic view showing an organic light emitting display.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Here, when one element is referred to as being connected to another element, one element may be not only directly connected to the another element but instead may be indirectly connected to the another element via one or more other elements. Also, when an element is referred to as being "on" another element, it can be directly on the another element or be indirectly on the another element with one or more intervening elements interposed therebetween. Further, some of the elements that are not essential to the complete description of the invention have been omitted for clarity. In addition, like reference numerals refer to like elements throughout.

Figure 2:
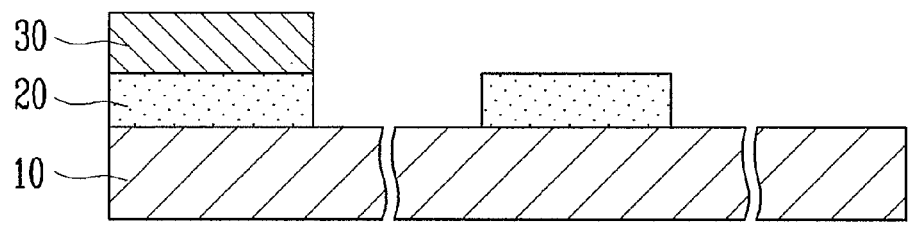
FIG. 2 is a cross-sectional schematic view showing a semiconductor device according to an embodiment of the present invention.

FIG. 2 is a cross-sectional schematic view showing a semiconductor device according to an embodiment of the present invention. FIG. 3A to FIG. 3E are cross-sectional schematic views of a semiconductor device for illustrating a method of manufacturing the semiconductor device shown in FIG. 2f.

An insulation layer is formed on a substrate 10. Here, the substrate 10 refers to all layers on which the insulation layer is formed. The insulation layer includes a first insulation layer 20 and a second insulation layer 30. The first insulation layer 20 and the second insulation layer 30 are arranged to have different patterns and are formed with different materials. Because, the first insulation layer 20 and the second insulation layer 30 are arranged to have different patterns, a first region, a second region, and a third region can result. That is, as shown in FIG. 2, both the first and second insulation layers 20 and 30 are present at the first region, only the first insulation layer 20 is present at the second region, and both of the first and second insulation layers 20 and 30 are absent at the third region.

To put it another way, the first insulation layer 20 and the second insulation layer 30 are overlapped with each other in the first region. Only the first insulation layer 20 is formed in the second region. The first and second insulation layers 20 and 30 are both absent in the third region.

In one embodiment, the first insulation layer 20 is formed of an inorganic material, which has a different etching characteristic from that of the second insulation layer 30. For example, $SiO_2$ or $SiN_X$ can be used as the inorganic material of the first insulation layer 20.

In one embodiment, the second insulation layer 30 is formed of an organic material. For example, acryl, poly imide, and/or benzocyclobutanes (BCB) may be used as the organic material of the second insulation layer 30.

Also, the second insulation layer 30 includes a photosensitive material. As described in more detail with reference to a manufacturing method according to an embodiment of the present invention, one reason for using the photosensitive material as the second insulation layer 30 is so that one mask (or a single mask) can be used to form double (or two different) insulation layers by using the second insulation layer 30 as a photo resist pattern. In one embodiment, 2,3,4-Trihydroxybenzophenone-orthonaphtoquinone 1,2-diazidesulfonic acid Triester as represented by the following chemical formula can be used as the photosensitive material.

Chemical formula 1

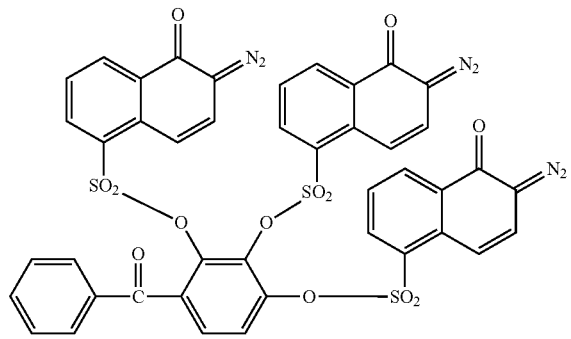

The following is a description of a method of manufacturing the semiconductor device including the double insulation layers.

Figure 3A:
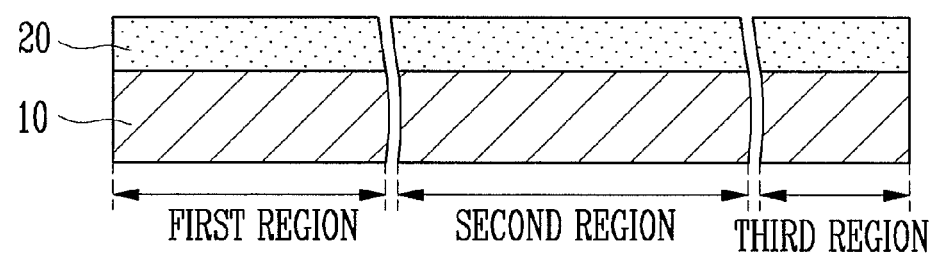
FIGS. 3A, 3B, 3C, 3D, and 3E are cross-sectional schematic views for illustrating a method of manufacturing the semiconductor device shown in FIG. 2.

First, as shown in FIG. 3A, the first insulation layer 20 is formed. For convenience of the description purposes, hereinafter, the first insulation layer and the second insulation layer in final and intermediate steps are all referred to as the 'first insulation layer 20' and the 'second insulation layer 30', respectively. In FIG. 3A, an entire surface of the substrate 10 is coated with the first insulation layer 20.

Figure 3B:
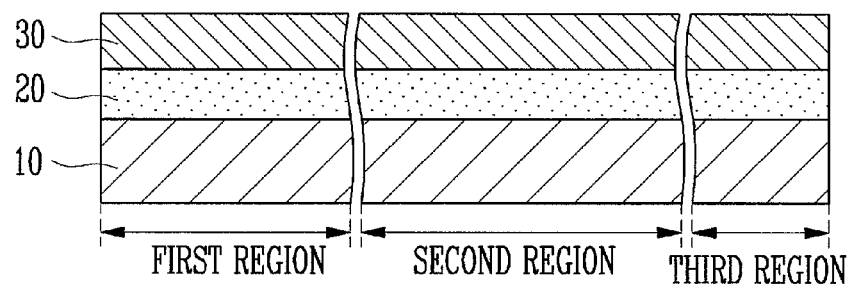

Next, as shown in FIG. 3B, the second insulation layer 30 including the photosensitive material is disposed on the first insulation layer 20. That is, the second insulation layer 30 using material different from that of the first insulation layer 20 is formed on the first insulation layer 20. In more detail and as shown in FIG. 3B, after a formation of the first insulation layer 20, an entire surface of the first insulation layer 20 is continuously coated with the second insulation layer 30.

Subsequently, the second insulation layer 30 is patterned to have a first region, a second region, and a third region. Here, in the first region, the second insulation layer 30 is formed to have a first pattern of a first thickness. In the second region, the second insulation layer 30 is formed to have a second pattern of a second thickness less than the first thickness, and in the third region, the second insulation layer 30 is removed to expose the first insulation layer 20 formed at a lower portion of the second insulation layer 30 (i.e., by removing the second insulation layer 30 in the third region, the first insulation layer 20 formed at the lower portion of the second insulation layer 30 is exposed).

Figure 3C:
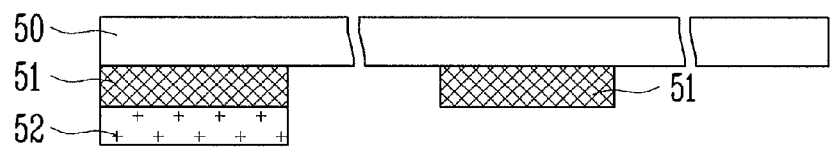
Figure 3C:
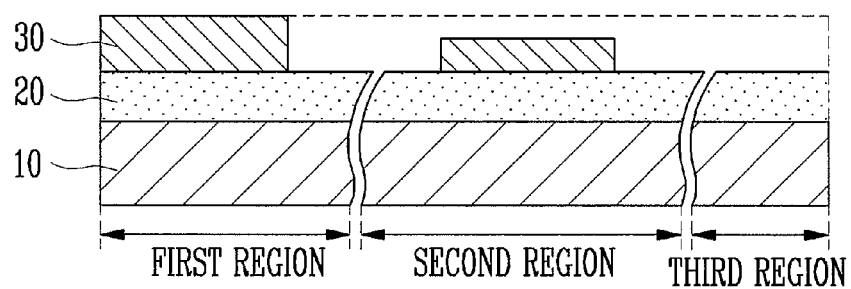

Referring to FIG. 3C, the patterning step of the second insulation layer 30 can be achieved by exposing and developing the second insulation layer 30 using a half tone mask 50 having different light-shielding degrees according to different regions.

That is, the half tone mask 50 includes a light-shielding pattern (or a full or high light-shielding pattern) corresponding to the first pattern, a partial light-shielding pattern corresponding to the second pattern, and an opening pattern (or a non-light shielding pattern) corresponding to the third pattern. Accordingly, in one embodiment, the half tone mask 50 causes the second insulation layer 30 to have different heights (or thickness) in accordance to different exposure regions.

As discussed and illustrated above, since the first region of the second insulation layer 30 is not exposed (or minimally exposed) to a developing light by the light-shielding pattern of the half tone mask 50, the second insulation layer 30 is not developed. Because a partial thickness of the second insulating layer 30 at the second region thereof is exposed to the developing light by the partial light-shielding pattern of the half tone mask 50, only a partially exposed part of an upper layer portion of the second insulation layer 30 is developed. No light-shielding patterns are used in the third region of the second insulation layer 30. That is, since an entire thickness of the second insulating layer 30 at the third region is exposed to the developing light, the entire portion of the second insulation layer 30 at the third region is all developed. Here, a transmittance degree of the developing light is changed by controlling a thickness of a partial light-shielding pattern in the mask or an exposure time, which allows a thickness of the second insulation layer 30 to be adjusted.

To put it another way, in the half tone mask 50, a laminate structure of a partial light-shielding pattern 51 and a light-shielding pattern 52 is formed at a corresponding part of the first region. Further, the half tone mask 50 on which only the partial light-shielding pattern 51 is formed may be used at a part corresponding to the second region. However, the present invention is not limited thereto. Here, the partial light-shielding pattern 51 is formed of a material such as MoSi, which partially transmits light, and the light-shielding pattern 52 is formed of a material such as chromium (Cr), which blocks (or fully blocks or cuts off) light.

Figure 3D:
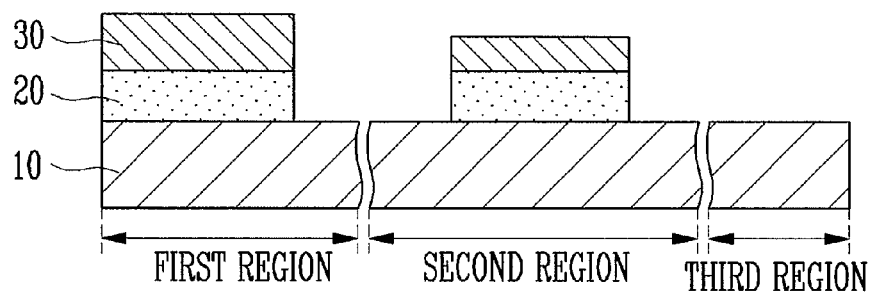

Referring now to FIG. 3D, the first insulation layer 20 of the third region is etched. The first insulation layer 20 may be etched by a wet etching method and/or a dry etching method.

Figure 3E:
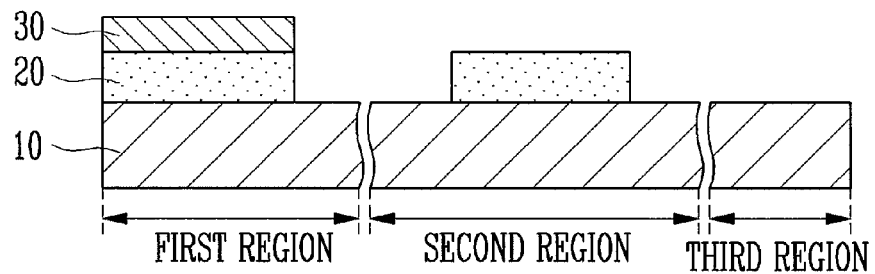

Referring now to FIG. 3E, the second pattern of the second insulation layer 30 at the second region is removed, and the second insulation layer 30 at the first region is ashed such that the first pattern of the second insulation layer 30 remains. Here, ashing is referred to as a process to remove a photo resist. In one embodiment of the present invention, because the second insulation layer 30 is used as a photo resist, a process for removing the second insulation layer 30 becomes an ashing process.

Hereinafter, as an application example of embodiments of the present invention described above, the following is a description of a method of manufacturing an organic light emitting display according an embodiment of the present invention.

Figure 4:
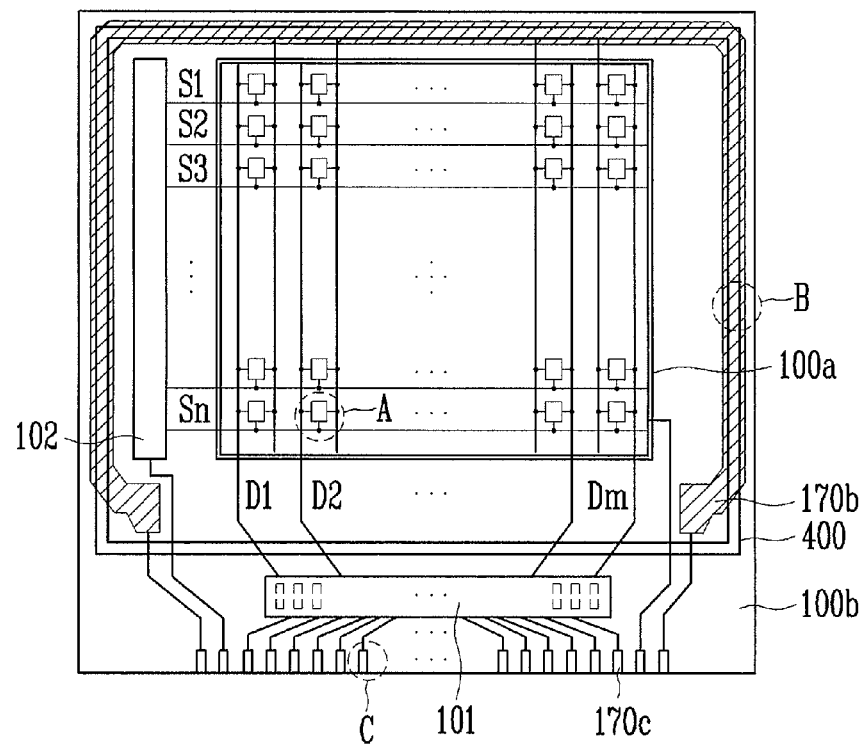
FIG. 4 is a plan schematic view showing an organic light emitting display according to an embodiment of the present invention.
Figure 5:
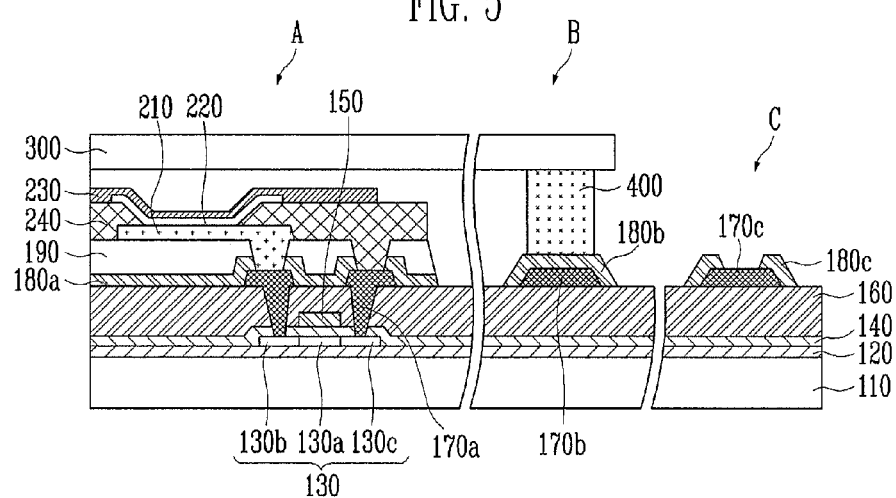
FIG. 5 is a cross-sectional schematic view showing parts A, B, and C of the organic light emitting display of FIG. 4.

FIG. 4 is a plan schematic view showing an organic light emitting display according to an embodiment of the present invention. FIG. 5 is a cross-sectional schematic view showing parts A, B, and C of the organic light emitting display of FIG. 4. The organic light emitting display includes a first substrate, a second substrate 300, and a sealing material 400. Here, the first substrate is referred to as a total substrate including an organic light emitting diode array. Further, a deposition substrate 110 is referred to as a substrate in which an organic light emitting diode is formed at an upper portion thereof.

The first substrate includes a display (or pixel) region 100a and a non-display (or non-pixel) region 100b. The display region 100a includes an organic light emitting diode array on which one or more organic light emitting diodes are formed. Each of the organic light emitting diodes includes a first electrode 210, an organic layer 220, and a second electrode 230. The non-display region 100b is formed at a peripheral part of the display region 100a. Driver integrated circuits 101 and 102, a sealing material 400, and metal wirings 170b and 170c are formed in the non-display region 100b.

The display region 100a includes a plurality of scan lines S1 to Sn arranged in a row direction and a plurality of data lines D1 to Dm arranged in a column direction. A plurality of pixels are formed at intersections of the scan lines and the data lines, and receive a signal for driving the organic light emitting diode from the driver integrated circuits 101 and 102.

Furthermore, a driver integrated circuit and metal wirings 170b and 170c are formed at the non-display region 100b. The driver integrated circuit drives the organic light emitting diode. The metal wirings 170b and 170c are electrically connected to the scan lines S1 to Sn and the data lines D1 to Dm of the display region 100a, respectively. In the embodiment of the present invention, the driver integrated circuit includes a data driver 101 and a scan driver 102.

In FIG. 4 and FIG. 5, the parts A, B, and C illustrate cross-sectional structures that indicate one section (or portion) of the display region 100a, one section in which the sealing material 400 of the non-display region is positioned, and one section of a pad portion.

The following is an explanation of the structure of the part A. A buffer layer 120 is formed on the deposition substrate 110. Here, the buffer layer 120 is formed of an insulation material such as silicon oxide ($SiO_2$) and/or silicon nitride ($SiN_x$). The buffer layer 120 prevents (or protects) the deposition substrate 110 from being damaged due to heat from an exterior.

A semiconductor layer 130 is formed on at least one region of the buffer layer 120. The semiconductor layer 130 includes an active region 130a, and source and drain regions 130b and 130c. A gate insulation layer 140 is formed on the semiconductor layer 130 and the buffer layer 120. A gate electrode 150 is formed on one region of the gate insulation layer 140, and has a size corresponding (or substantially corresponding) to a width of the active region 130a.

An interlayer insulating layer 160 is formed on the gate insulation layer 140 including the gate electrode 150. Source and drain electrodes 170a are formed on regions (or predetermined regions) of the interlayer insulating layer 160.

The source and drain electrodes 170a are connected to exposed regions of the source and drain regions 130b and 130b. First insulation layers 180a, 180b, 180c (together referred to as the 'first insulation layer 180') are formed on the interlayer insulating layer 160 including the source and drain electrodes 170a.

In one embodiment, the first insulation layer 180 is formed of an inorganic material. The first insulation layer 180 can also be referred to as the 'passivation layer'. However, the present invention is not limited thereto.

A second insulation layer 190 is formed on the first insulation layer 180, and is made of a material different from that of the first insulation layer 180. The second insulation layer 190 can also be referred to as the 'planarization layer'. However, the present invention is not limited thereto. Here, the second insulation layer 190 is formed of a photo resist layer. For example, a photosensitive material is added to an organic material to form the second insulation layer 190. The organic material can be acryl, poly imide, and/or benzocyclobutanes (BCB). Also, as an example, 2,3,4-Trihydroxybenzophenone-orthonaphtoquinone 1,2-diazidesulfonic acid Triester as represented by the following chemical formula can be used as the photosensitive material.

Chemical formula 1

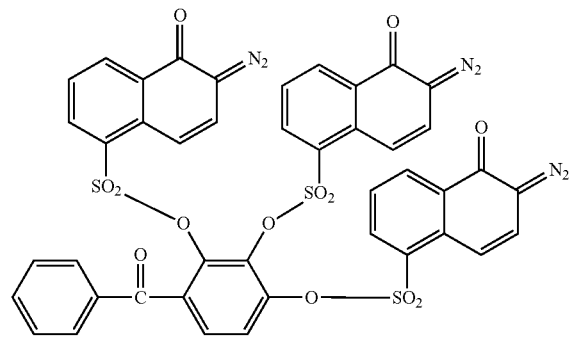

A first electrode 210 is formed on one region of the second insulation layer 190. Here, the first electrode 210 is connected to one exposed region of one of the source and drain electrodes 170a by a via hole penetrating the first insulation layer 180 and the second insulation layer 190.

A pixel defining layer 240 is formed on the second insulation layer 190 including the first electrode 210, and includes an opening portion for exposing at least one region of the first electrode 210. An organic layer 220 is formed on the opening portion of the pixel defining layer 240. A second electrode 230 is formed on the pixel defining layer 240 including the organic layer 220. Here, a passivation layer can be further formed at an upper portion of the second electrode 230.

The second substrate 300 seals at least the display region 100a on which the one or more organic light emitting diodes are formed. In a case in which the organic light emitting display is a top-emission display or a double-sided emission display, the second substrate 300 is formed of a transparent material. By contrast, in a case in which the organic light emitting display is a bottom-emission display, the second substrate 300 is formed of an opaque material.

In one embodiment of the present invention, the second substrate 300 is constructed to be a plate type substrate (or to have a plate shape). The second substrate 300 seals at least the display region on the deposition substrate 110, on which the one or more organic light emitting diodes are formed. In one embodiment, the second substrate 300 seals all regions on the deposition substrate 110 except for a data driver and a pad portion.

The sealing material 400 is formed between the second substrate 300 and the non-display region 100b of the deposition substrate 110, and seals the display region 100 so as to prevent an infiltration of ambient air. The sealing material 400 may be formed of organic and/or inorganic material. When the inorganic material is used as the sealing material 400, it includes an absorber for absorbing a laser and a filler for reducing a thermal expansion coefficient. The inorganic material can be $K_2O$, $Fe_2O_3$, $Sb_2O_3$, $ZnO$, $P_2O_5$, $V_2O_5$, $TiO_2$, $Al_2O_3$, $B_2O_3$, $WO_3$, $SnO$, and/or $PbO$. Here, when the inorganic material is used as the sealing material 400, a formation line of the sealing material 400 overlaps with a metal wiring. In this case, when a laser or infrared rays are irradiated to the sealing material 400, the metal wiring may be damaged. Accordingly, in one embodiment of the present invention, the first insulation layer 180 formed of (or including) an inorganic material is provided (or used) to protect from this metal wiring damage. Further, when the organic material is used as the sealing material 400, epoxy resin may be used.

Figure 6A:
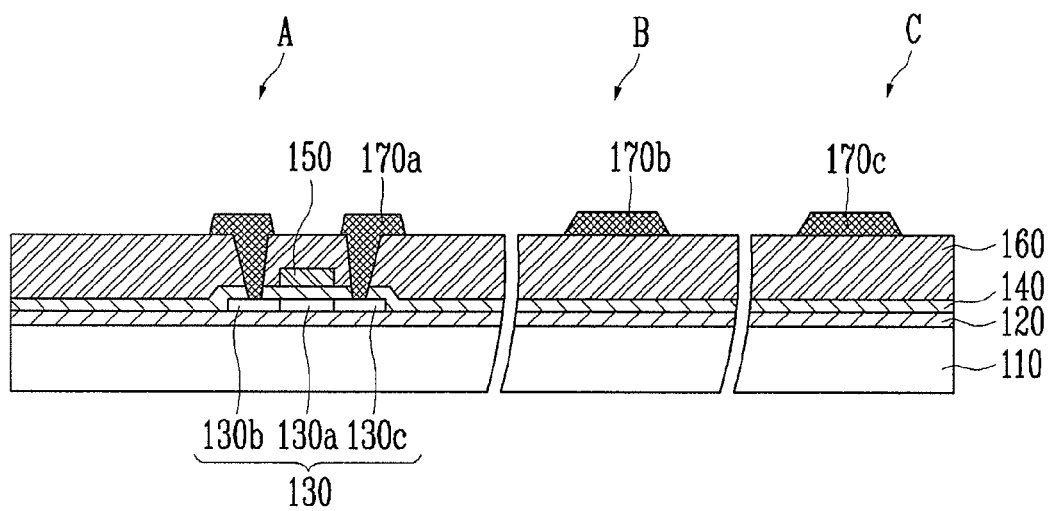
FIGS. 6A, 6B, 6C, 6D, 6E, and 6F are cross-sectional schematic views for illustrating a method of manufacturing an organic light emitting display according to an embodiment of the present invention.
Figure 6B:
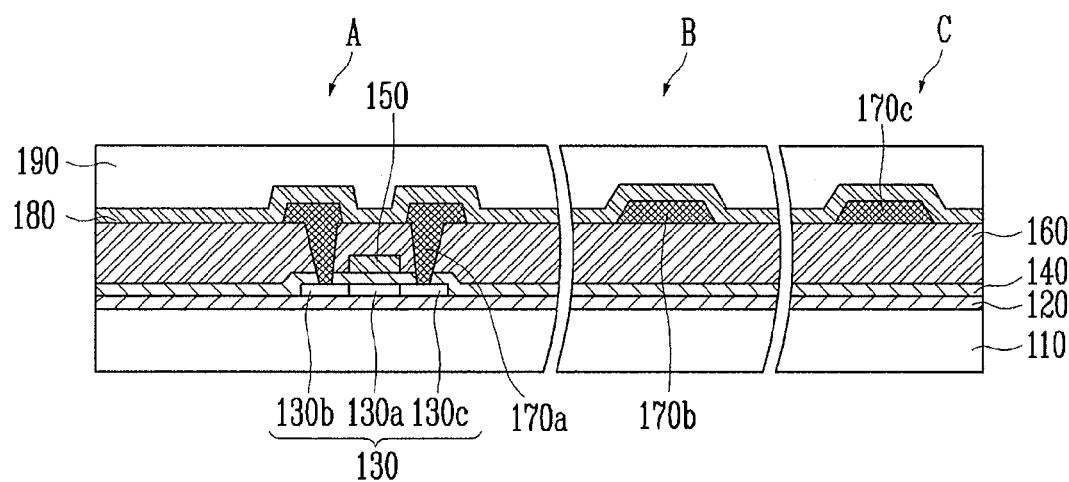
Figure 6C:
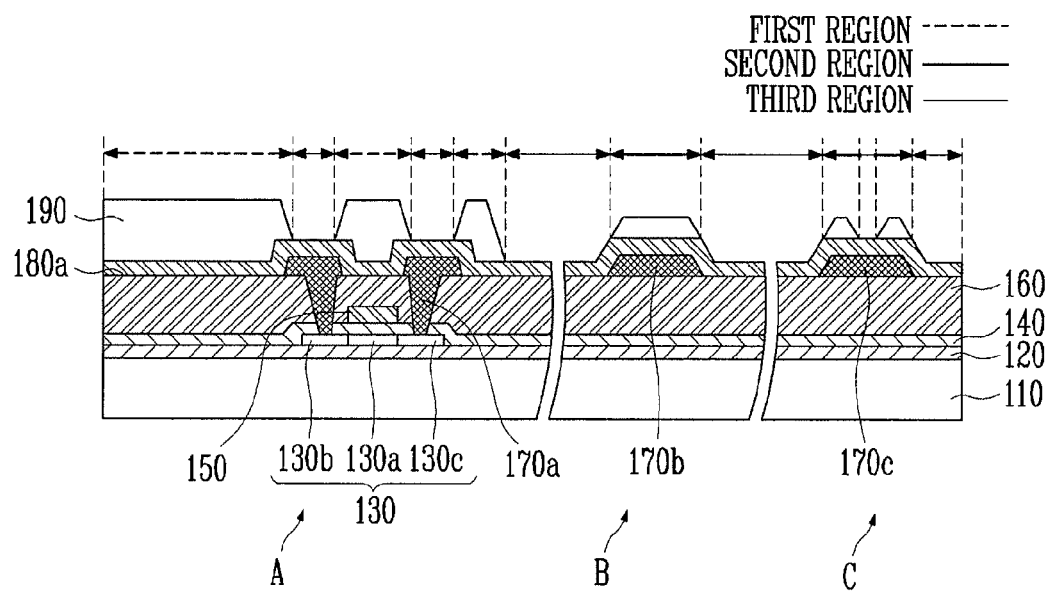
Figure 6D:
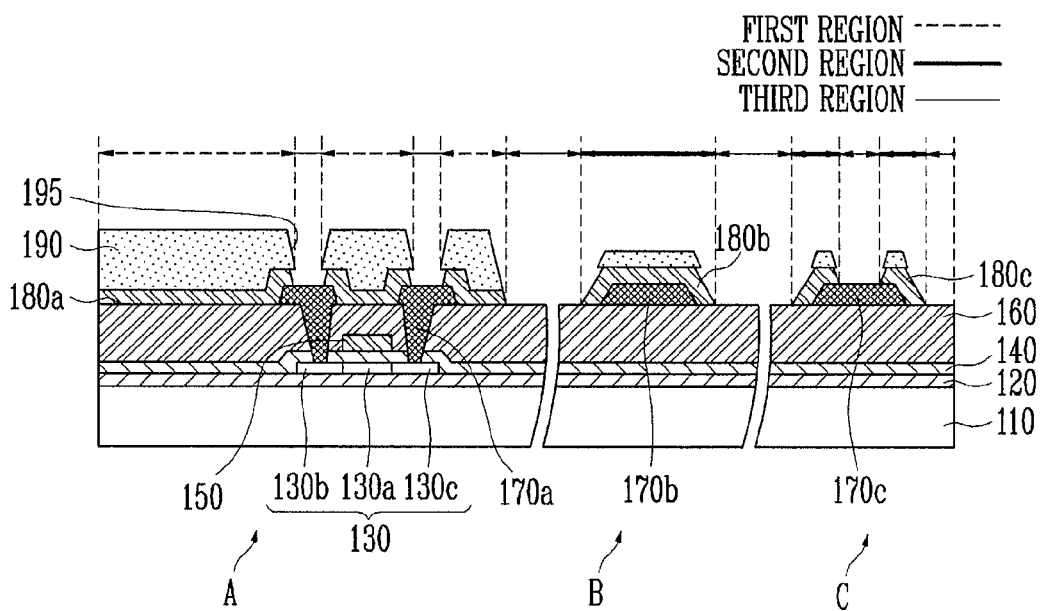
Figure 6E:
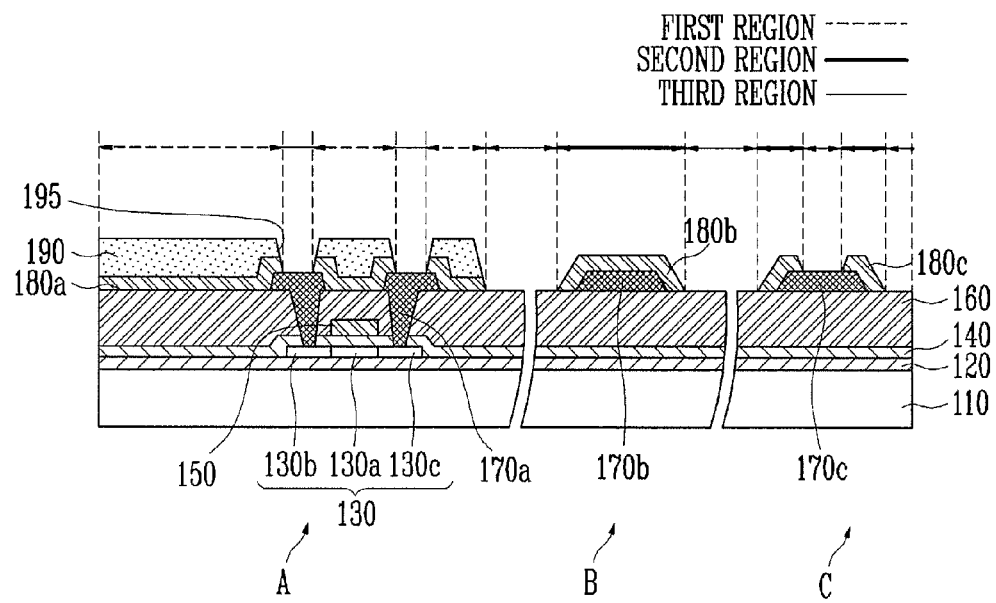

In addition, referring also to FIG. 6E, the part A includes a first region and a third region. The first insulation layer 180 and the second insulation layer 190 are formed in the first region as double insulation layers. The first insulation layer 180 and the second insulation layer 190 are absent at the third region.

The following is an explanation of a structure of the part B. The part B is a formation position of the sealing material 400. The aforementioned buffer layer 120 is extended and formed on the deposition substrate 110. The gate insulation layer 140 is extended and formed at an upper portion of the buffer layer 120. The interlayer insulating layer 160 is formed at an upper portion of the gate insulation layer 140. The first metal wiring 170b is formed at an upper portion of the interlayer insulating layer 160, and is made of the same (or substantially the same) material as that of the source and drain electrodes 170a. Here, in one embodiment, the first metal wiring 170b is a power line, but the present invention is not limited thereto. The first insulation layer 180 is formed on the metal wiring 170b to protect the first metal wiring 170b. The sealing material 400 is provided on the insulation layer 180. Here, referring also to FIG. 6E, the part B includes a second region and the third region. The first insulation layer 180 (or only the first insulation layer 180) is present in the second region as a single insulation layer. The first insulation layer 180 and the second insulation layer 190 are both absent at the third region.

The following is a description of a structure of the part C. The part C is a pad portion, which is connected to a terminal of a flexible printed circuit board (FPCB) for supplying an electric signal from an exterior. The aforementioned buffer layer 120 is extended and formed on the deposition substrate 110. The gate insulation layer 140 is extended and formed at an upper portion of the buffer layer 120. The interlayer insulating layer 160 is formed at an upper portion of the gate insulation layer 140. A second metal wiring 170c is formed at an upper portion of the interlayer insulating layer 160, and is made of the same material (or substantially the same material) as that of the source and drain electrodes 170a. Here, the second metal wiring 170c can be any suitable metal wirings connected from a terminal to a data line, a scan line, or a power line. The first insulation layer 180 is formed on the second metal wiring 170c to expose one section of the second metal wiring 170c. Here, referring also to FIG. 6E, the part C includes the second region and the third region. The first insulation layer 180 is present in the second region, and insulation layers are absent in the third region.

Also, FIG. 5 shows that, in the part C, the second metal wiring is formed by the same process (or only the same process) as that of the source and drain electrodes. However, the present invention is not thereby limited. For example, one embodiment of the present invention provides (or further provides) a metal wiring, which is formed during a formation of the gate electrode.

Hereinafter, a method of manufacturing an organic light emitting display according to an embodiment of the present invention will be explained below.

As illustrated earlier with reference to the aforementioned embodiments and referring to FIG. 6A, the buffer layer 120, the semiconductor layer 130, the gate insulation layer 140, the gate electrode 150, the interlayer insulating layer 160, and the source and drain electrodes 170a are sequentially formed on the deposition substrate 110 in the part A. Also, the first substrate in an intermediate manufacturing state including the buffer layer 120, the gate insulation layer 140, the interlayer insulating layer 160, and the metal wirings 170b and 170c are provided in FIG. 6A.

Next, referring to FIG. 6B, the first insulation layer 180 and the second insulation layer 190 are formed at an entire surface of the first substrate. Here, in FIG. 6B, after the formation of the first insulation layer 180, the second insulation layer 190 is continuously formed without a separate patterning process.

Subsequently, the second insulation layer 190 is patterned to have the first region, the second region, and the third region as described above with respect to FIG. 5. Here, in the first region, the second insulation layer 190 is formed to have a first pattern of a first thickness. In the second region, the second insulation layer 190 is formed to have a second pattern of a second thickness less than the first thickness. Further, in the third region, the second insulation layer 190 is removed to expose the first insulation layer 180 formed at a lower portion of the second insulation layer 190 (i.e., by removing the second insulation layer 190 in the third region, the first insulation layer 180 is exposed).

For example, the first region may be a region between the source electrode and the drain electrode of the part A, and the second region may be regions in the part B and the part C. The third region may be an upper portion of the source and drain electrodes of the part A, and/or an upper portion of a metal wiring of the part C.

Referring to FIG. 6C, the patterning step of the second insulation layer 190 can be achieved by exposing and developing the second insulation layer 190 using a half tone mask (e.g., mask 50 of FIG. 3C) having different light-shielding degrees according to different regions.

That is, the half tone mask includes a light-shielding pattern corresponding to the first pattern, a partial light-shielding pattern corresponding to the second pattern, and an opening pattern corresponding to the third pattern. Accordingly, in one embodiment, the half tone mask causes the second insulation layer 190 to have different heights (or thickness) according to different exposure regions.

As discussed and illustrated above, since the first region of the second insulation layer 190 is not exposed to a developing light by a light-shielding pattern of the half tone mask, the second insulation layer 190 is not developed. Because a partial thickness of the second insulating layer 190 at the second region thereof is exposed to the developing light by the partial light-shielding pattern of the half tone mask, only a partially exposed part of an upper layer portion of the second insulation layer 190 is developed. No light-shielding patterns are used in the third region of the second insulation layer 190. That is, since an entire thickness of the second insulation layer 190 at the third region is exposed to the developing light, the entire portion of the second insulation layer 190 at the third region is all developed. Here, a transmittance degree of the developing light is changed by controlling a thickness of a partial light-shielding pattern in the mask or an exposure time, which allows a thickness of the second insulation layer 190 to be adjusted (FIG. 6C).

In a next step, the first insulation layer 180 of the third region is etched. The first insulation layer 180 can be etched by a wet etching method and/or a dry etching method. As described above, the third region may be source and drain electrode regions of the part A, a terminal region of a pad portion contacting with an FPCB of the part C, and/or a terminal region of a pad portion contacting with a driver integrated circuit.

Accordingly, referring to FIG. 6D and as a main process, a layer formed at a lower portion of the third region (for example, the source and drain electrodes of the part A and the metal wiring of the part C) is exposed to an outside. Furthermore, a via hole of an intermediate step penetrating the first insulation layer 180 and the second insulation layer 190 is formed in the part A (FIG. 6D).

In a next step, referring to FIG. 6E, the second insulation layer 190 is ashed. The second insulation layer 190 remaining at the second region is completely removed. At this time, since the second insulation layer 190 on the first region is removed to the same degree as the second region, a stepper portion of the second insulation layer 190, (see FIG. 6D) forming an inner surface of the via hole 195 (penetrating the first insulation layer 180 and the second insulation layer 190), is removed, so that the inner surface of the via hole 195 is formed to have a smooth surface (see FIG. 6E).

Figure 6F:
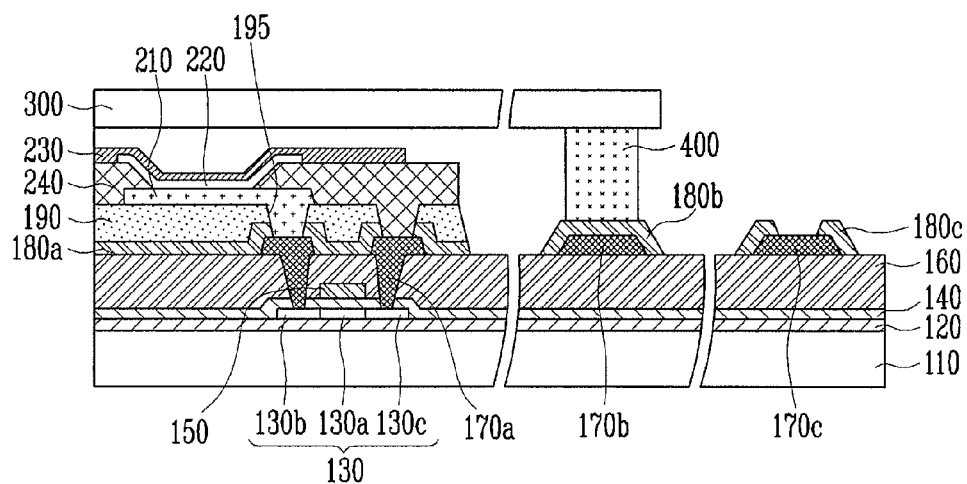

Thereafter, referring to FIG. 6F, organic light emitting diodes, each having a first electrode, an organic thin film, and a second electrode, are formed in the part A. The second substrate 300 is provided to face the first substrate and a sealing material is provided in the part B. Further, a terminal of the FPCB is connected to the part C (FIG. 6F).

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof. For example, although certain embodiments of the present invention were described as being formed (or obtained) with (or by) a positive photosensitive layer, other embodiments of the present invention can be formed with a negative photosensitive layer.

What is claimed is:

1. A semiconductor device including double insulation layers formed on a substrate, the double insulation layers comprising:
    a first insulation layer having a first pattern; and
    a second insulation layer on the first insulation layer and comprising a photosensitive material, the second insulation layer having a second pattern differing from the first pattern and comprising a material differing from that of the first insulation layer;
    wherein the insulation layers of the device are arranged to comprise:
        a first region in which the first insulation layer and the second insulation layer overlap to form the double insulation layers;
        a second region in which the first insulation layer covers at least substantially an entire length of a wiring that extends substantially from one end of the substrate to another end of the substrate without the second insulation layer; and
        a third region in which the first and second insulation layers are absent.

2. The semiconductor device as claimed in claim 1, wherein the first insulation layer comprises an inorganic material.

3. The semiconductor device as claimed in claim 2, wherein the inorganic material of the first insulation layer comprises $SiO_2$ and/or $SiN_x$.

4. The semiconductor device as claimed in claim 1, wherein the second insulation layer comprises an organic material.

5. The semiconductor device as claimed in claim 4, wherein the organic material comprises acryl, poly imide, and/or benzocyclobutanes (BCB).

6. The semiconductor device as claimed in claim 1, wherein the photosensitive material of the second insulation layer is:

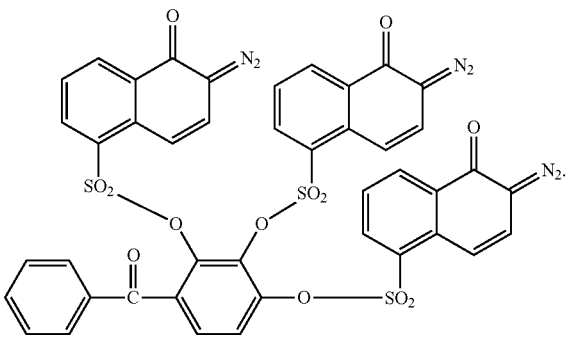

7. The semiconductor device as claimed in claim 1, wherein the photosensitive material of the second insulation layer comprises 2,3,4-Trihydroxybenzophenone-orthonaphtoquinone 1,2-diazidesulfonic acid Triester.

8. An organic light emitting display including a display region formed on a substrate; a non-display region being electrically connected to the display region in which at least one terminal is disposed; and double insulation layers, the double insulation layers comprising:
    a first insulation layer having a first pattern; and
    a second insulation layer on the first insulation layer and comprising a photosensitive material, the second insulation layer having a second pattern differing from the first pattern and comprising a material differing from that of the first insulation layer, wherein the display region comprises a double-insulation region in which the first insulation layer and the second insulation layer overlap to form the double insulation layers, and a non-insulation region in which the first and second insulation layers are absent, and wherein the non-display region comprises a single-insulation region in which the first insulation layer covers at least substantially an entire length of a wiring that extends substantially from one end of the substrate to another end of the substrate without the second insulation layer, and a non-insulation region in which the first and second insulation layers are absent.

9. The organic light emitting display as claimed in claim 8, wherein the display region on the substrate comprises a thin film transistor having a semiconductor layer, a gate insulation layer, a gate electrode, an interlayer insulating layer, a source electrode, and a drain electrode formed on the substrate, wherein the first insulation layer is disposed on the thin film transistor, and wherein the second insulation layer is disposed on the first insulation layer.

10. The organic light emitting display as claimed in claim 8, wherein the non-display region includes a gate insulation layer, an interlayer insulating layer, and a metal wiring, the gate insulation layer and the interlayer insulating layer extending from the display region, and wherein the first insulation layer is disposed on the interlayer insulating layer and the metal wiring.

11. The organic light emitting display as claimed in claim 8, wherein the non-insulation region of the display region includes a region in which source and drain electrodes are disposed.

12. The organic light emitting display as claimed in claim 8, wherein the single-insulation region of the non-display region includes a region in which a sealing material is disposed.

13. The organic light emitting display as claimed in claim 8, wherein the non-insulation region of the non-display region includes a region in which a first pad portion terminal and a second pad portion terminal are disposed, wherein a Flexible Printed Circuit Board (FPCB) is connected to the first pad portion terminal, and wherein a drive integrated circuit is connected to the second pad portion terminal.

14. An organic light emitting display having a display region and a non-display region on a substrate, the display comprising:
a thin film transistor;
a first insulation layer on the thin film transistor having a first pattern;
a second insulation layer on the first insulation layer and comprising a photosensitive material, the second insulation layer having a second pattern differing from the first pattern and comprising a material differing from that of the first insulation layer; and
an organic light emitting diode on the second insulating layer,
wherein the first insulation layer and the second insulation layer are arranged such that the display has a double-insulation region in which the first insulation layer and the second insulation layer overlap to form double insulation layers, a non-insulation region in which the first and second insulation layers are absent, and a single-insulation region in which the first insulation layer covers at least substantially an entire length of a wiring that extends substantially from one end of the substrate to another end of the substrate without the second insulation layer,
wherein the display region comprises portions with the double-insulation region and portions with the non-insulation region, and
wherein the non-display region comprises portions with the single-insulation region and portions with the non-insulation region.

* * * * *